US010503295B2

(12) United States Patent
Lee et al.

(10) Patent No.: US 10,503,295 B2
(45) Date of Patent: Dec. 10, 2019

(54) TOUCH SENSING SUBSTRATE

(71) Applicant: SuperC-Touch Corporation, New Taipei (TW)

(72) Inventors: Hsiang-Yu Lee, New Taipei (TW); Shang Chin, New Taipei (TW); Ping-Tsun Lin, New Taipei (TW)

(73) Assignee: SUPERC-TOUCH CORPORATION, New Taipei (TW)

( * ) Notice: Subject to any disclaimer, the term of this patent is extended or adjusted under 35 U.S.C. 154(b) by 0 days.

(21) Appl. No.: 15/700,576

(22) Filed: Sep. 11, 2017

(65) Prior Publication Data

US 2018/0074629 A1 Mar. 15, 2018

(30) Foreign Application Priority Data

Sep. 12, 2016 (TW) .............................. 105129656 A

(51) Int. Cl.
*G06F 3/041* (2006.01)
*G06F 3/044* (2006.01)
*G02F 1/1333* (2006.01)
*G02F 1/1362* (2006.01)
(Continued)

(52) U.S. Cl.
CPC .......... *G06F 3/0412* (2013.01); *G02F 1/1368* (2013.01); *G02F 1/13338* (2013.01); *G02F 1/13624* (2013.01); *G02F 1/136227* (2013.01); *G02F 1/136286* (2013.01); *G06F 3/044* (2013.01); *G06F 3/0416* (2013.01); *G02F 2201/121* (2013.01); *G02F 2201/123* (2013.01); *G06F 2203/04104* (2013.01); *G06F 2203/04107* (2013.01); *G06F 2203/04112* (2013.01); *H01L 27/323* (2013.01); *H01L 27/3262* (2013.01); *H01L 27/3276* (2013.01)

(58) Field of Classification Search
CPC combination set(s) only.
See application file for complete search history.

(56) References Cited

U.S. PATENT DOCUMENTS

2010/0156840 A1* 6/2010 Frey ........................ G06F 3/044
345/174
2012/0169635 A1* 7/2012 Liu ........................ G06F 3/0412
345/173

(Continued)

*Primary Examiner* — Deeprose Subedi
(74) *Attorney, Agent, or Firm* — Muncy, Geissler, Olds & Lowe, P.C.

(57) ABSTRACT

A touch sensing substrate includes a substrate, plural thin film transistor switch sets, plural touch sensing electrodes, plural touch sensing signal wires, plural touch sensing control wires, plural display drive thin film transistors, and plural pixel electrodes. Each thin film transistor switch set is arranged on one side of a substrate. Each touch sensing electrode corresponds to a thin film transistor switch set connected to the touch sensing electrode corresponding thereto. Each touch sensing signal wire is connected to at least two thin film transistor switch sets. Each touch sensing control wire is connected to the thin film transistor switch sets corresponding to at least two touch sensing electrodes. By the touch sensing control wires, the touch sensing signal wires, and the corresponding thin film transistor switch sets, a touch sensing signal from the touch sensing electrodes can be applied to a touch control circuit with less signal wires.

10 Claims, 14 Drawing Sheets

(51) Int. Cl.
*G02F 1/1368* (2006.01)
*H01L 27/32* (2006.01)

(56) References Cited

U.S. PATENT DOCUMENTS

| | | | | |
|---|---|---|---|---|
| 2013/0328829 A1* | 12/2013 | Lee | ........................ | G06F 3/0412 345/174 |
| 2014/0092346 A1* | 4/2014 | Yang | ................. | G02F 1/133308 349/84 |
| 2014/0125880 A1* | 5/2014 | Tsai | .................... | G02F 1/13338 349/12 |
| 2015/0277651 A1* | 10/2015 | Zhang | ................... | G06F 3/0416 345/173 |
| 2016/0062504 A1* | 3/2016 | Hwang | ................. | G06F 3/0412 345/174 |
| 2016/0291726 A1* | 10/2016 | Li | .......................... | G06F 3/0412 |
| 2017/0153758 A1* | 6/2017 | Lu | ........................ | G02F 1/13306 |
| 2018/0039349 A1* | 2/2018 | Han | ........................ | G06F 3/041 |

* cited by examiner

TOUCH SENSING SUBSTRATE

BACKGROUND OF THE INVENTION

1. Field of the Invention

The present invention relates to the technical field of touch sensing and, more particularly, to a touch sensing substrate.

2. Description of Related Art

The current electronic device is often equipped with a touch panel serving as one of its input devices. Based on the sensing principles, touch panels can be classified into a plurality of types, such as resistance type, capacitance type, ultrasonic type and optical type. Besides, with the widespread use of the smart phones, the multi-touch technique is getting more and more important. Currently, the multi-touch technique is generally implemented by projected capacitive technique. The projected capacitive technique can be classified into self-capacitance sensing technique and mutual-capacitance sensing technique.

To save the cost, the touch components are integrated into a display panel, so that the display panel itself is provided with the touch function, thereby eliminating an additional process for combining the display panel with a touch panel. FIG. 1 is a schematic diagram illustrating the prior self-capacitance detection technique. As shown in FIG. 1, a plurality of transparent sensing electrodes 110 are disposed on an ITO transparent sensing electrode layer 100. Each transparent sensing electrode 110 transmits a signal detected by the transparent sensing electrode 110 through a signal wire 120 corresponding thereto. Due to the space requirement for the layout of the signal wire 120, it needs more space to allow the layout of a plurality of signal wires 120 in the region denoted by an ellipse A. Therefore, the transparent sensing electrodes 110 adjacent to the ellipse region (A) have to be decreased in size, and the distance between two transparent sensing electrodes 110 is relatively increased, resulting in generation of dead zones in touch sensing. When the touch technique is applied to a display panel, the number of display gate lines and display data lines of the display panel has to be increased, resulting in that the layout of the signal wires 120 is getting more and more difficult. Accordingly, there is a need for the prior touch sensing technique to be improved so as to eliminate the aforementioned problems.

SUMMARY OF THE INVENTION

The object of the present invention is to provide a touch sensing substrate, which makes use of a plurality of thin film transistor switch sets, a plurality of touch sensing signal wires and a plurality of touch sensing control wires to effectively reduce the number of signal wires for the touch sensing electrodes. When the present touch sensing substrate is applied to a flexible printed circuit, the area of the flexible printed circuit can be reduced as the number of signal wires is greatly reduced, so as to save the cost. When the present touch sensing substrate is applied to a display substrate, the wire layout problem of the display substrate can be solved as the number of signal wires is greatly reduced. Thus, the present touch sensing substrate is suitable for narrow-boarder display panels.

To achieve the object, there is provided a touch sensing substrate, which comprises a substrate; a plurality of thin film transistor switch sets, a plurality of touch sensing electrodes, a plurality of touch sensing signal wires, a plurality of display drive thin film transistors, and a plurality of pixel electrodes. The plurality of thin film transistors are arranged on one side of the substrate. The area of each touch sensing electrode is not smaller than 500 μm$^2$ and each touch sensing electrode corresponds to one of the thin film transistor switch sets. Each thin film transistor switch set includes at least a thin film transistor switch having a drain/source electrically connected to a touch sensing electrode corresponding thereto. Each touch sensing signal wire is connected to the thin film transistor switch sets corresponding to at least two touch sensing electrodes. The plurality of touch sensing signal wires are further electrically connected to a touch control circuit. Each touch sensing control wire is connected to the thin film transistor switch sets corresponding to at least two touch sensing electrodes. The plurality of display gate lines and the plurality of display data lines are arranged along a first direction and a second direction, respectively. A display drive thin film transistor is disposed at a position where one display gate line and one display data line are intersected, and the display drive thin film transistor has a gate connected to the display gate line, and a drain/source connected to the display data line. The drain/source of each display drive thin film transistor is connected to one of the pixel electrodes.

DETAILED DESCRIPTION OF THE PREFERRED EMBODIMENT

Figure 2:
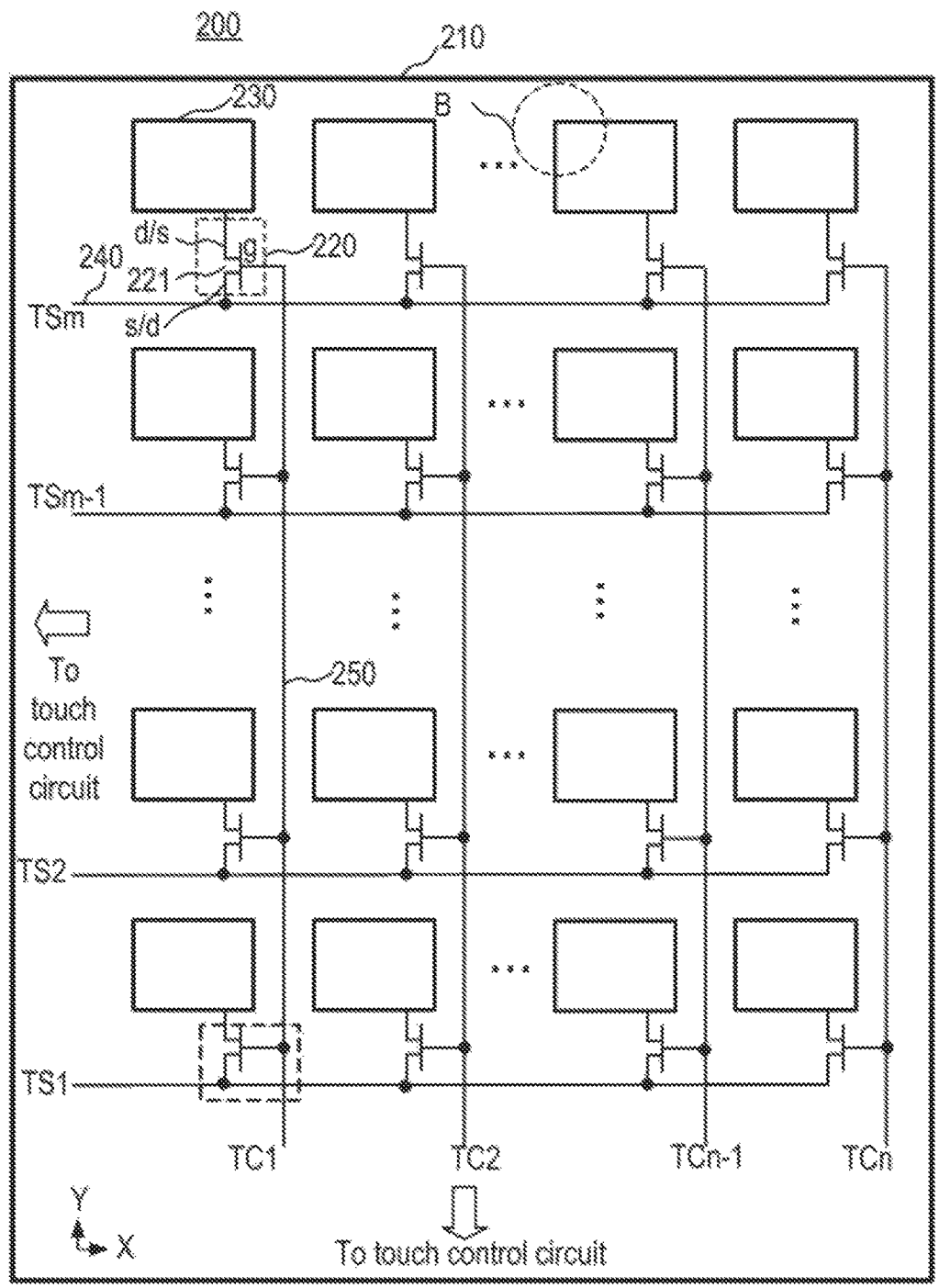
FIG. 2 is a schematic diagram of the touch sensing substrate according to the present invention.

FIG. 2 is a schematic diagram of a touch sensing substrate 200 according to the present invention. As shown in FIG. 2, the touch sensing substrate 200 includes a substrate 210, a plurality of thin film transistor switch sets 220, a plurality of touch sensing electrodes 230, a plurality of touch sensing signal wires 240, a plurality of touch sensing control wires 250, a plurality of display gate lines 310 (shown in FIG. 3), a plurality of display data lines 320 (shown in FIG. 3), a plurality of display drive thin film transistor 330 (shown in FIG. 3), and a plurality of pixel electrodes 340 (shown in FIG. 3).

The touch sensing substrate 200 is a thin film transistor substrate of a liquid crystal display or an organic light-emitting diode (OLED) display. The substrate 210 is a glass substrate or a polymer thin film substrate.

The thin film transistor switch sets 220 are arranged on one side of the substrate 210. The area of each touch sensing electrode 230 is not smaller than 500 $\mu m^2$, and each touch sensing electrode 230 corresponds to one thin film transistor switch set 220. The thin film transistor switch set 200 includes at least a thin film transistor switch 221 having a drain/source (d/s) electrically connected to a touch sensing electrode 230 corresponding thereto. Each touch sensing signal wire 240 is connected to the thin film transistor switch sets 220 corresponding to at least two touch sensing electrodes 230. The touch sensing signal wires 240 are further electrically connected to a touch control circuit (not shown). Each sensing control wire 250 is connected to the thin film transistor switch sets 220 corresponding to at least two touch sensing electrodes 230. As shown in FIG. 2, each touch sensing control wire 250 is connected to the gates (g) of the thin film transistor switches 221 of the thin film transistor switch sets 220 in one column.

Figure 3:
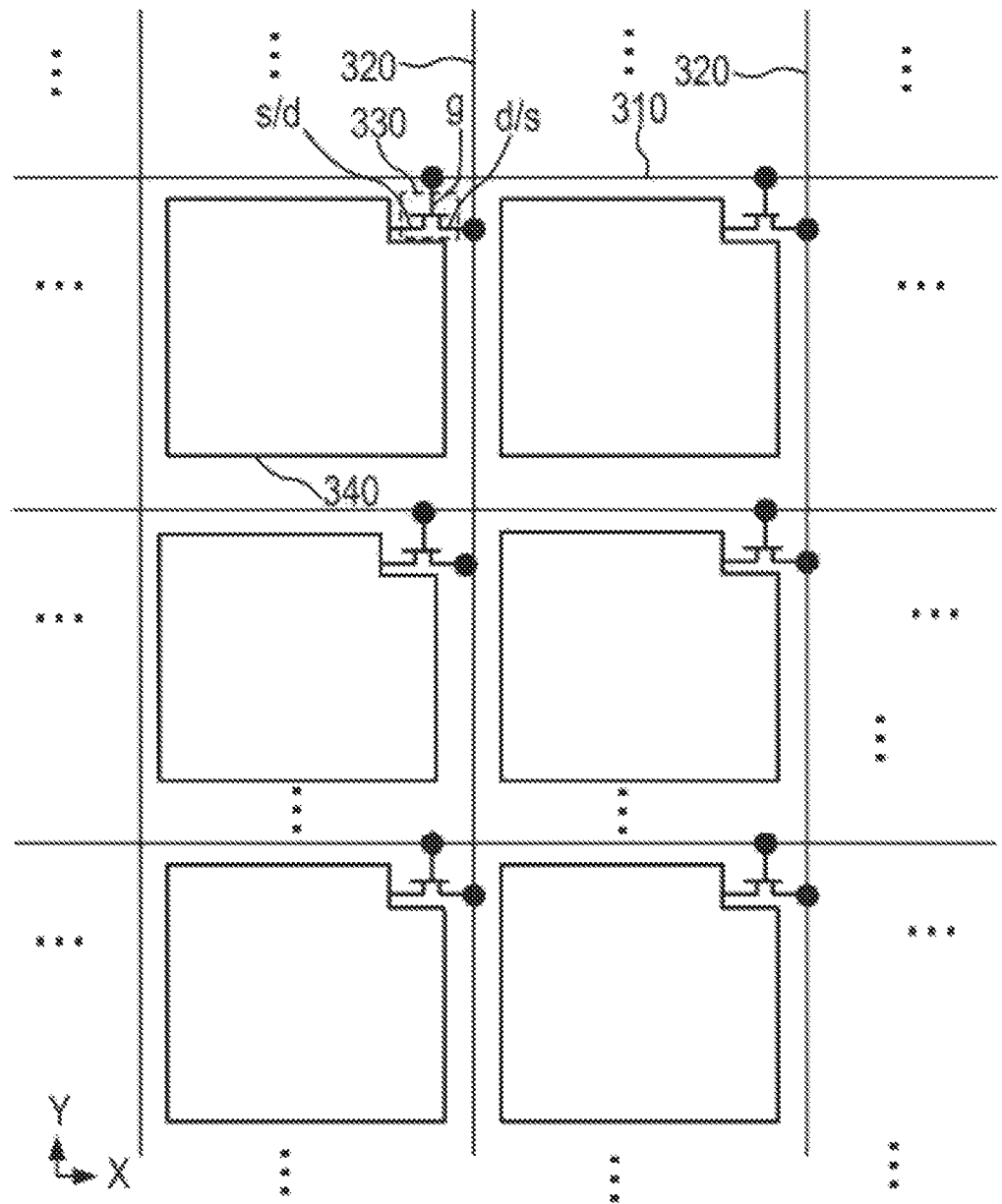
FIG. 3 is another schematic diagram of the touch sensing substrate according to the present invention.

Due to that the display components and touch components are significantly different in sizes, the related display components of the substrate 210 are not shown in FIG. 2. FIG. 3 is another schematic diagram of the touch sensing substrate 200 according to the present invention. FIG. 3 is an enlarged view of a circle region (B) in FIG. 2, which illustrates the related display components.

The display gate lines 310 and the display data lines 320 are arranged along a first direction (X-axis direction) and a second direction (Y-axis direction), respectively. There is a display drive thin film transistor 330 disposed at a position where one display gate line 310 and one display data line 320 are intersected. The display drive thin film transistor 330 has a gate (g) connected to the display gate line 310, and a drain/source (d/s) connected to the display data line 320. The source/drain (s/d) of each display drive thin film transistor 330 is connected to one of the pixel electrodes 340.

Figure 4:
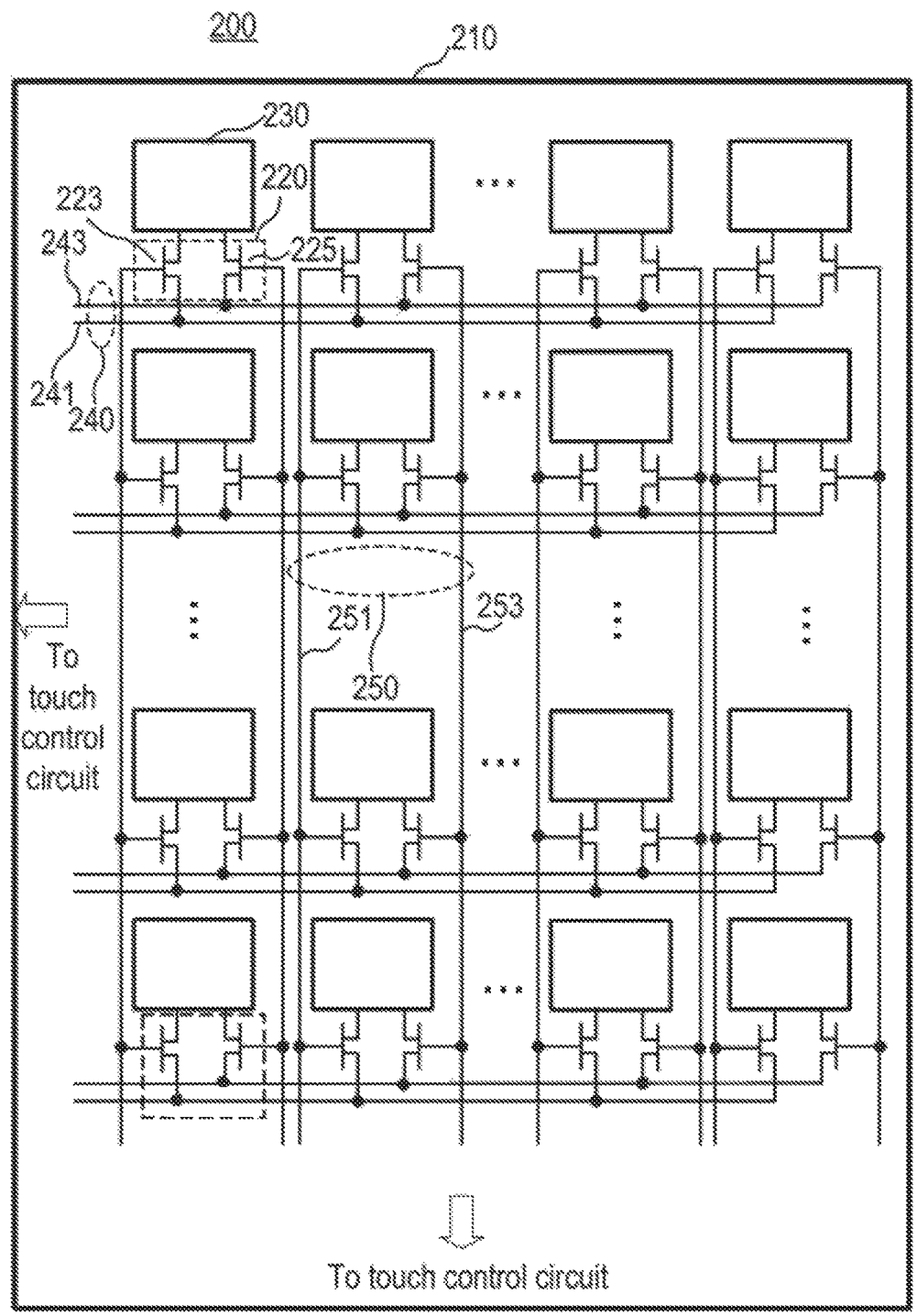
FIG. 4 is still another schematic diagram of the touch sensing substrate according to the present invention.

FIG. 4 is still another schematic diagram of the touch sensing substrate 200 according to the present invention. As shown in FIG. 4, each touch sensing electrode 230 corresponds to a thin film transistor switch set 220. The thin film transistor switch set 220 includes two thin film transistor switches 223 and 225. In FIG. 4, a thin film transistor switch set 220 corresponds to two touch sensing signal wires 241 and 243 and two touch sensing control wires 251 and 253.

Figure 5:
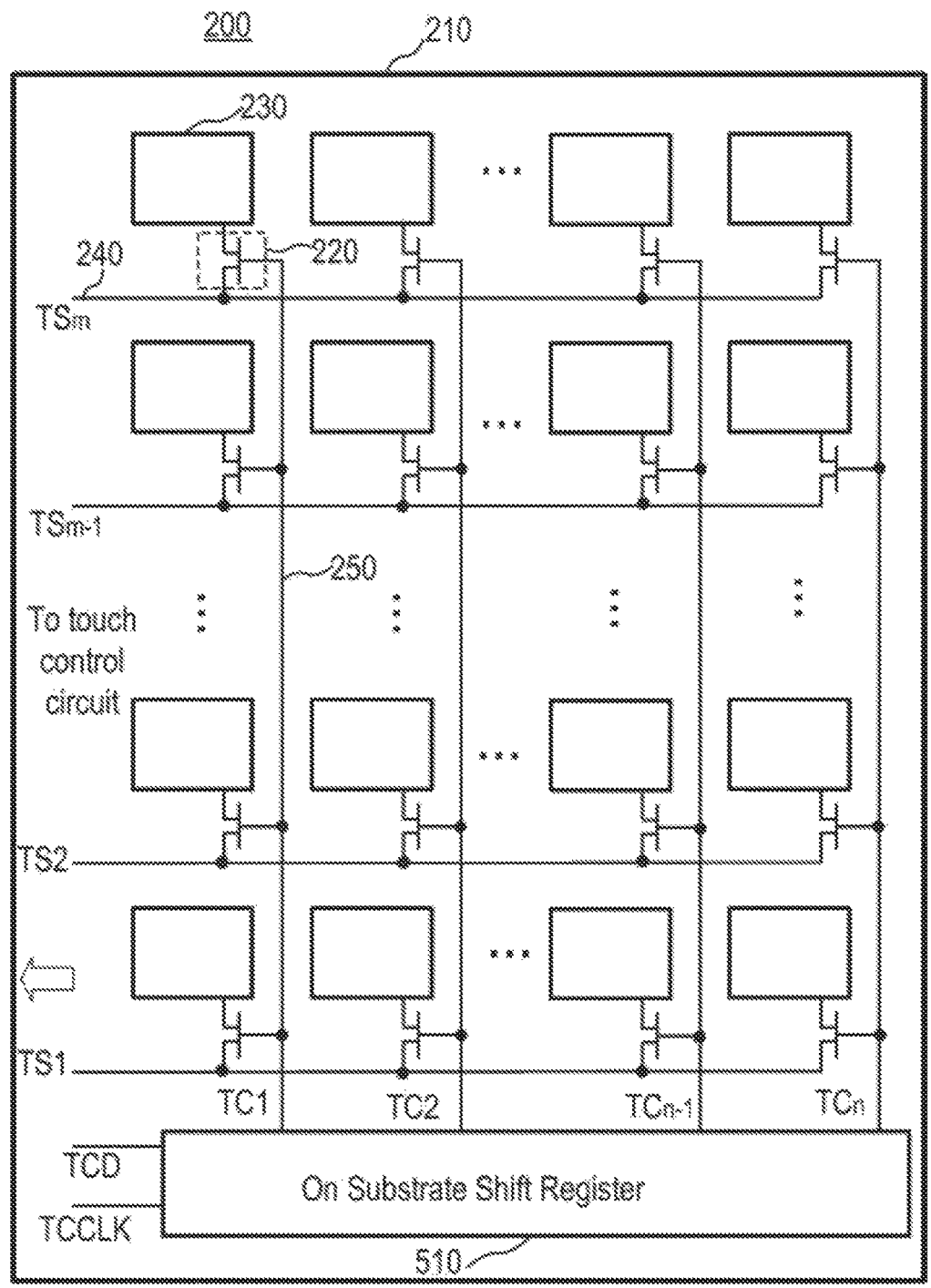
FIG. 5 is further another schematic diagram of the touch sensing substrate according to the present invention.

FIG. 5 is further another schematic diagram of the touch sensing substrate 200 according to the present invention, which is similar to FIG. 2 except that, in FIG. 5, it further includes an on substrate shift register 510. The output of the on substrate shift register 510 includes a plurality of output terminals respectively connected to the touch sensing control wires 250. The input of the on substrate shift register 510 includes at least a touch data wire TCD and a touch control clock wire TCCLK connected to a touch control circuit (not shown).

Figure 6:
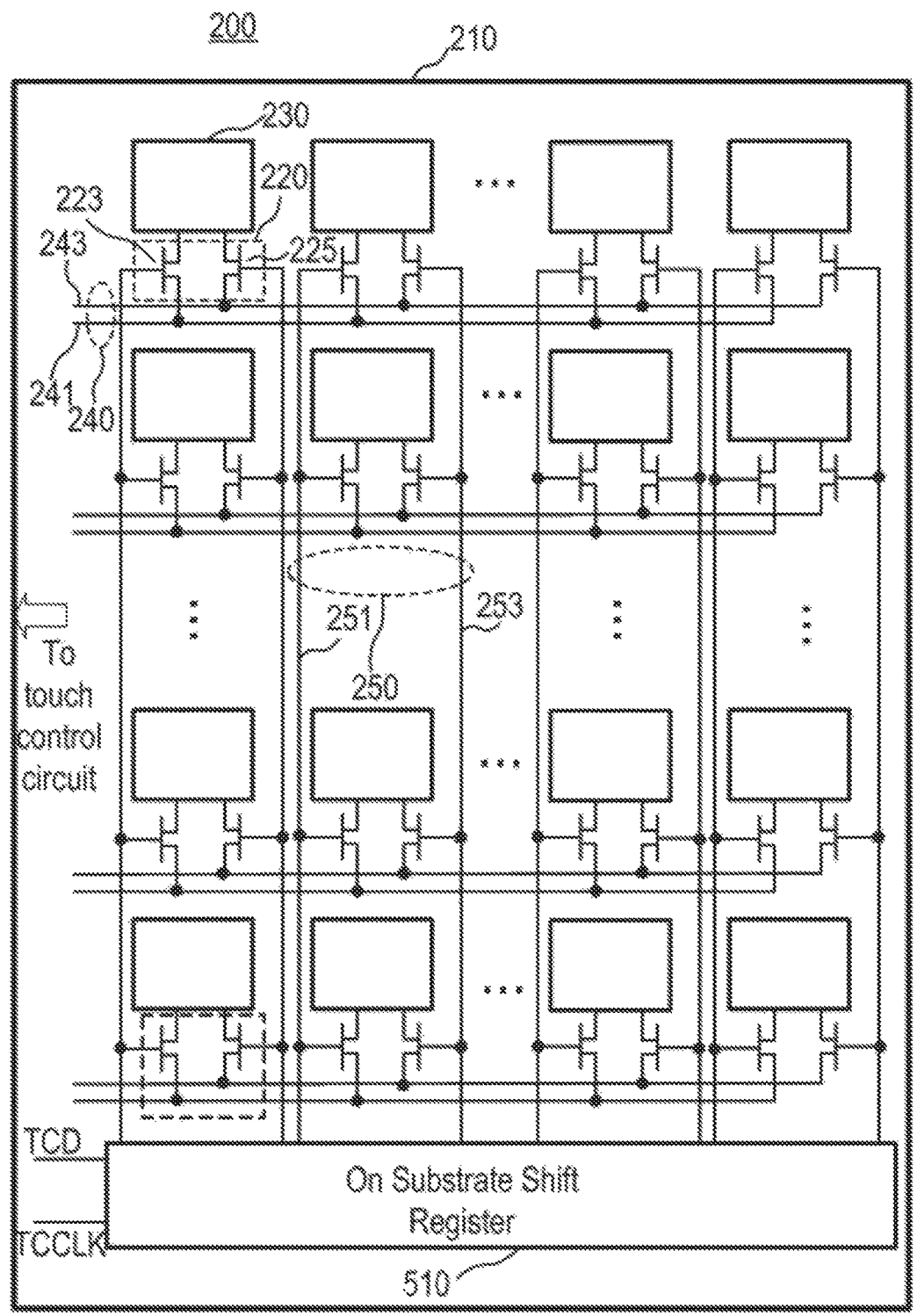
FIG. 6 is still further another schematic diagram of the touch sensing substrate according to the present invention.

FIG. 6 is still further another schematic diagram of the touch sensing substrate 200 according to the present invention, which is similar to FIG. 4 except that, in FIG. 6, it further includes an on substrate shift register 510. The output of the on substrate shift register 510 includes a plurality of output terminals respectively connected to the touch sensing control wires 250. The input of the on substrate shift register 510 includes at least a touch data wire TCD and a touch control clock wire TCCLK connected to a touch control circuit (not shown).

In view of FIG. 5 and FIG. 6, it is known that the on substrate shift register 510 can transmit a touch control signal from the at least a touch control data wire TCD to the plurality of touch sensing control wires 250, sequentially, according to a clock signal from the touch control clock wire TCCLK, so as to turn on/off the thin film transistor switch set 220 corresponding thereto. In comparison with the circuits of FIG. 2 and FIG. 4, in FIG. 5 and FIG. 6, when a touch control circuit (not shown) is disposed on a flexible print circuit, the touch sensing control wires 250 are directly connected to the touch control circuit without using a flexible flat cable, while it only needs to connect the touch control clock wire TCCLK and at least a touch control data wire TCD to the touch control circuit through a flexible flat cable. Thus, the area of the flexible flat cable can be greatly reduced, and the number of the wires on the substrate 210 can be dramatically decreased, thereby making the layout more easily. This advantage becomes more obvious when the resolution of touch sensing is increased.

Figure 7:
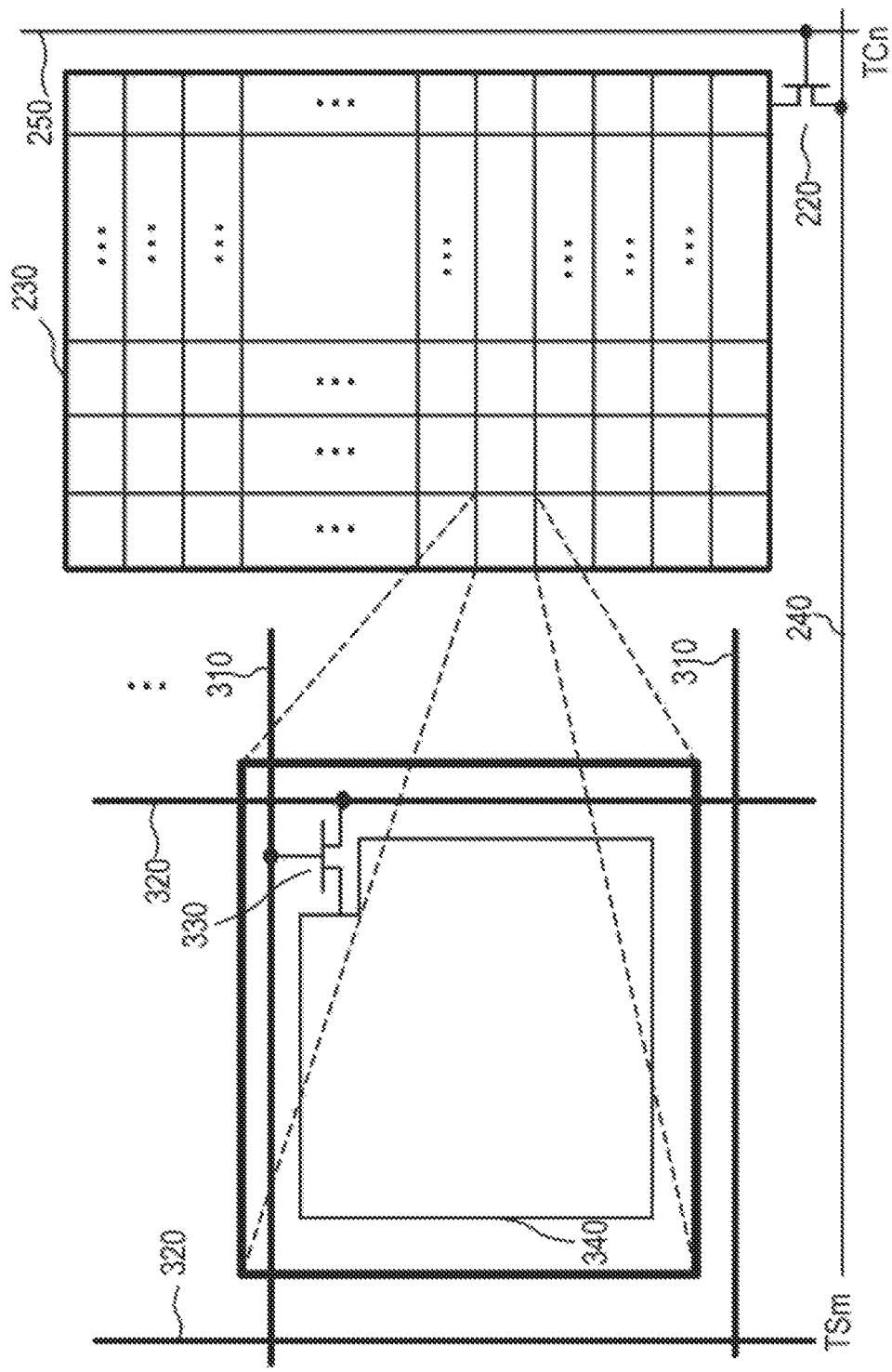
FIG. 7 is a schematic diagram illustrating the touch sensing electrodes and the pixel electrodes according to the present invention.

FIG. 7 is a schematic diagram illustrating the touch sensing electrodes 230 and the pixel electrodes 340 according to the present invention. As shown in FIG. 7, the width of one touch sensing electrode 230 is about 5 mm, and the width of one pixel electrode 340 is about 5 $\mu m$. Thus, there may be thousands of pixel electrodes 340 corresponding to the region of a touch sensing electrode 230.

Figure 8:
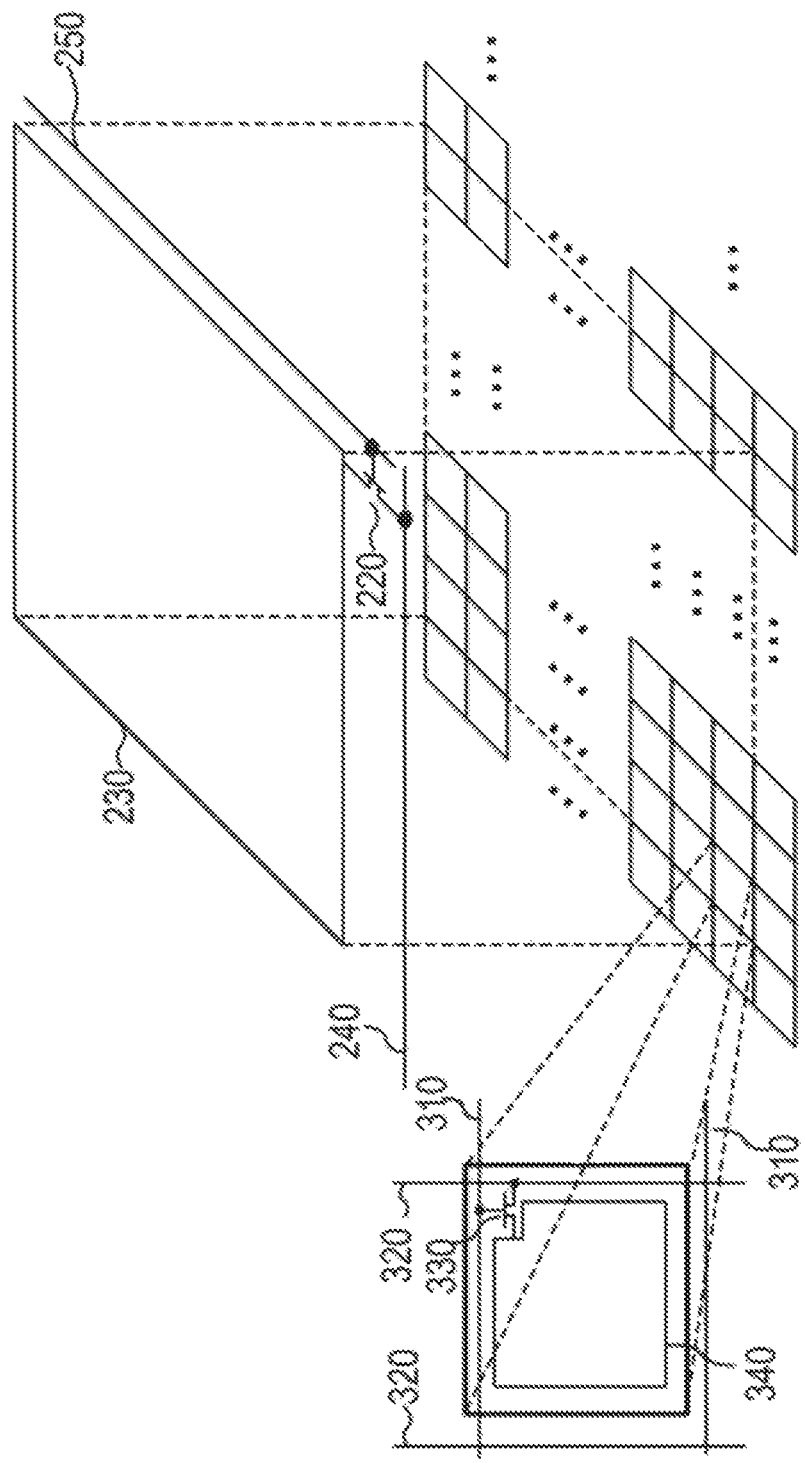
FIG. 8 is a schematic diagram illustrating the position relationship between the touch sensing electrodes and the pixel electrodes according to the present invention.

FIG. 8 is a schematic diagram illustrating the position relationship between the touch sensing electrodes 230 and the pixel electrodes 340 according to the present invention. A touch sensing electrode layer formed by the touch sensing electrodes 230 and a display layer formed by the pixel electrodes 340 are arranged on different layers. To sense whether there is a finger touch, the touch sensing electrode layer formed by the touch sensing electrodes 230 is arranged above the display layer formed by the pixel electrodes 340. In this case, the touch sensing electrodes 230 are transparent conductive electrodes to avoid shielding the pixel electrodes and influencing the display quality. The plurality of touch sensing electrodes 230 are formed by transparent conductive martial selected from the group consisting of Indium Tin Oxide (ITO), Indium Zinc Oxide (IZO), Zinc Tin Oxide (ZTO), conductive polymer and carbon nanotube.

Figure 9:
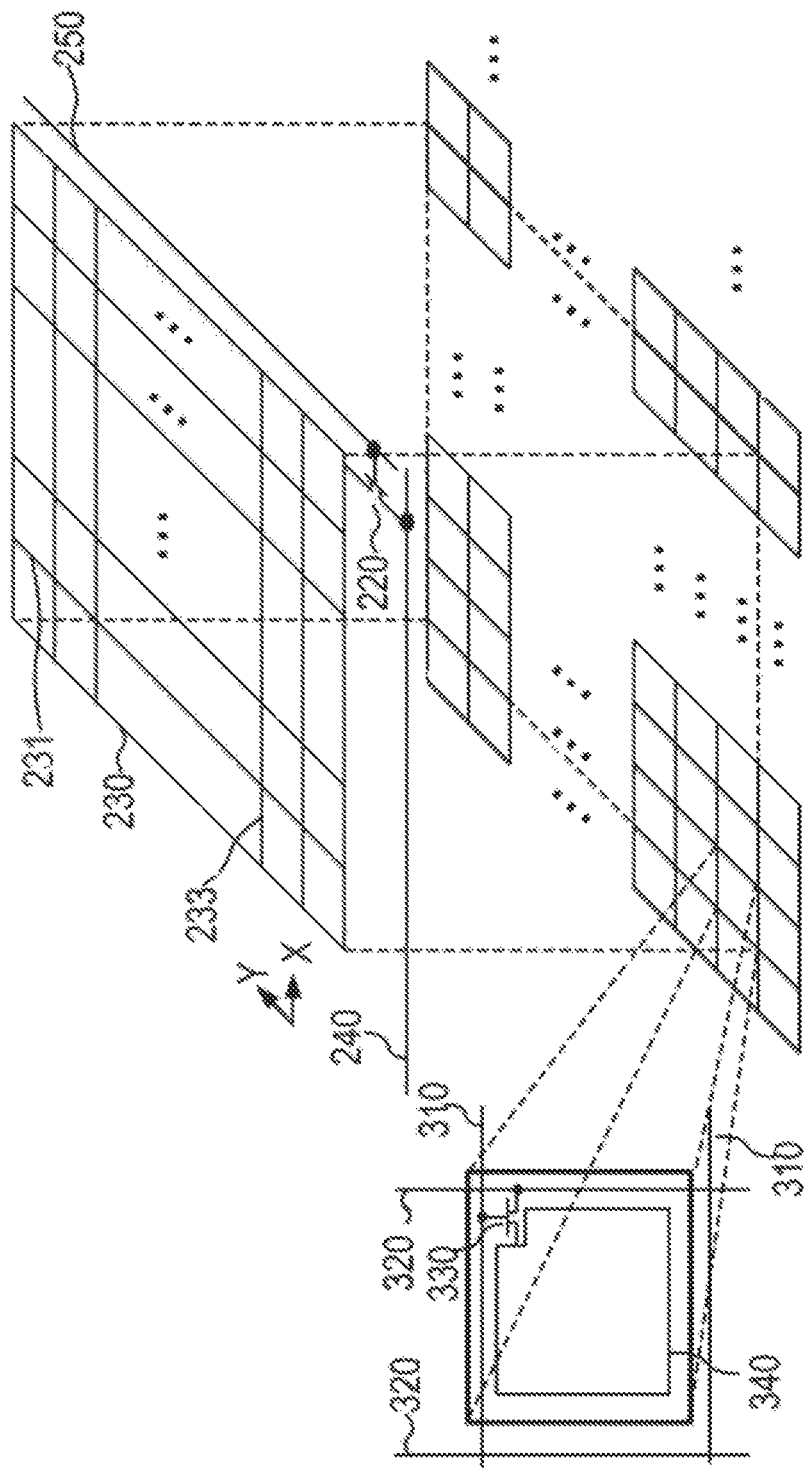
FIG. 9 is another schematic diagram illustrating the position relationship between the touch sensing electrodes and the pixel electrodes according to the present invention.

When the touch sensing electrode layer formed by the touch sensing electrodes 230 and the display layer formed by the pixel electrodes 340 are arranged on different layers, the touch sensing electrode 230 can be a metal mesh-like electrode. FIG. 9 is another schematic diagram illustrating the position relationship between the touch sensing electrodes 230 and the pixel electrodes 340 according to the present invention, which is similar to FIG. 8 except that, in FIG. 9, instead of being made by transparent conductive material, the touch sensing electrode 230 is the metal mesh-like electrode composed by a plurality of metal wires 231 and 233 respectively arranged along the first direction (X-axis direction) and the second direction (Y-axis direction). The positions of the plurality of metal wires 231 and 233 correspond to those of the plurality of display gate lines 310 and the plurality of display data lines 320. In general, the plurality of display gate lines 310 and the plurality of display data lines 320 are shielded by the black matrix (BM), and thus cannot be seen by the user. Therefore, when the positions of the plurality of metal wires 231 and 233 correspond to those of the plurality of display gate lines 310 and display data lines 320, the plurality of metal wires 231 and 233 are also shielded by the black matrix, and thus cannot be seen by the user.

Figure 10:
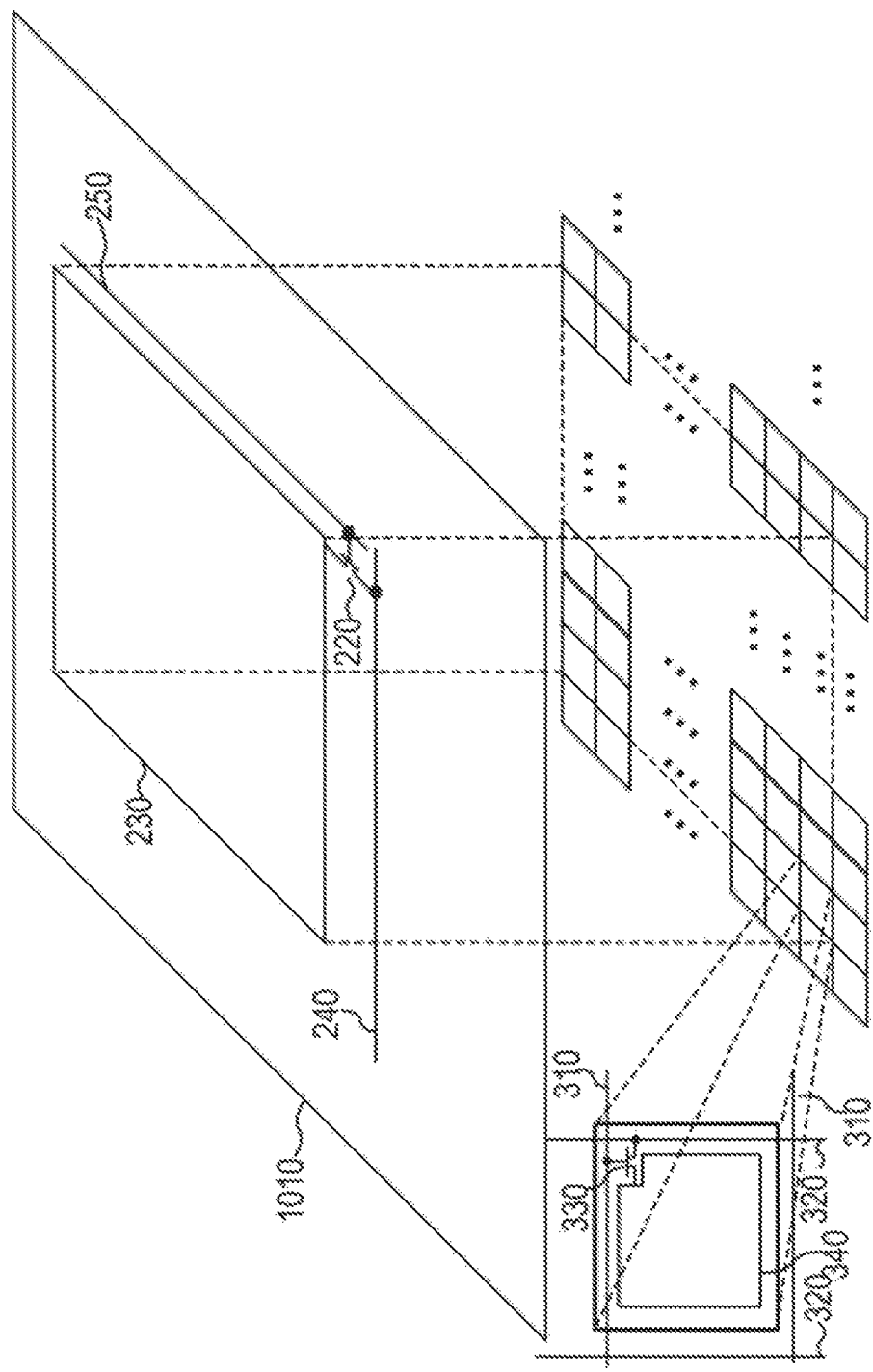
FIG. 10 is still another schematic diagram illustrating the position relationship between the touch sensing electrodes and the pixel electrodes according to the present invention.

FIG. 10 is still another schematic diagram illustrating the position relationship between the touch sensing electrodes 230 and the pixel electrodes 340 according to the present invention, which is similar to FIG. 8 except that, in FIG. 10, there is at least a common electrode layer 1010 arranged between the touch sensing electrode layer formed by the touch sensing electrodes 230 and the display layer formed by the pixel electrodes 340, and the at least a common electrode layer 1010 is disposed between the touch sensing signal wires 240 and the display data lines 320 to form a shielding between the touch sensing signal wires 240 and the display data lines 320. In the display operation, the at least a common electrode layer 1010 applies a common voltage. The common electrode layer 1010 is preferably made by transparent conductive material selected from the group consisting of Indium Tin Oxide (ITO), Indium Zinc Oxide (IZO), Zinc Tin Oxide (ZTO), conductive polymer and carbon nanotube.

Figure 11:
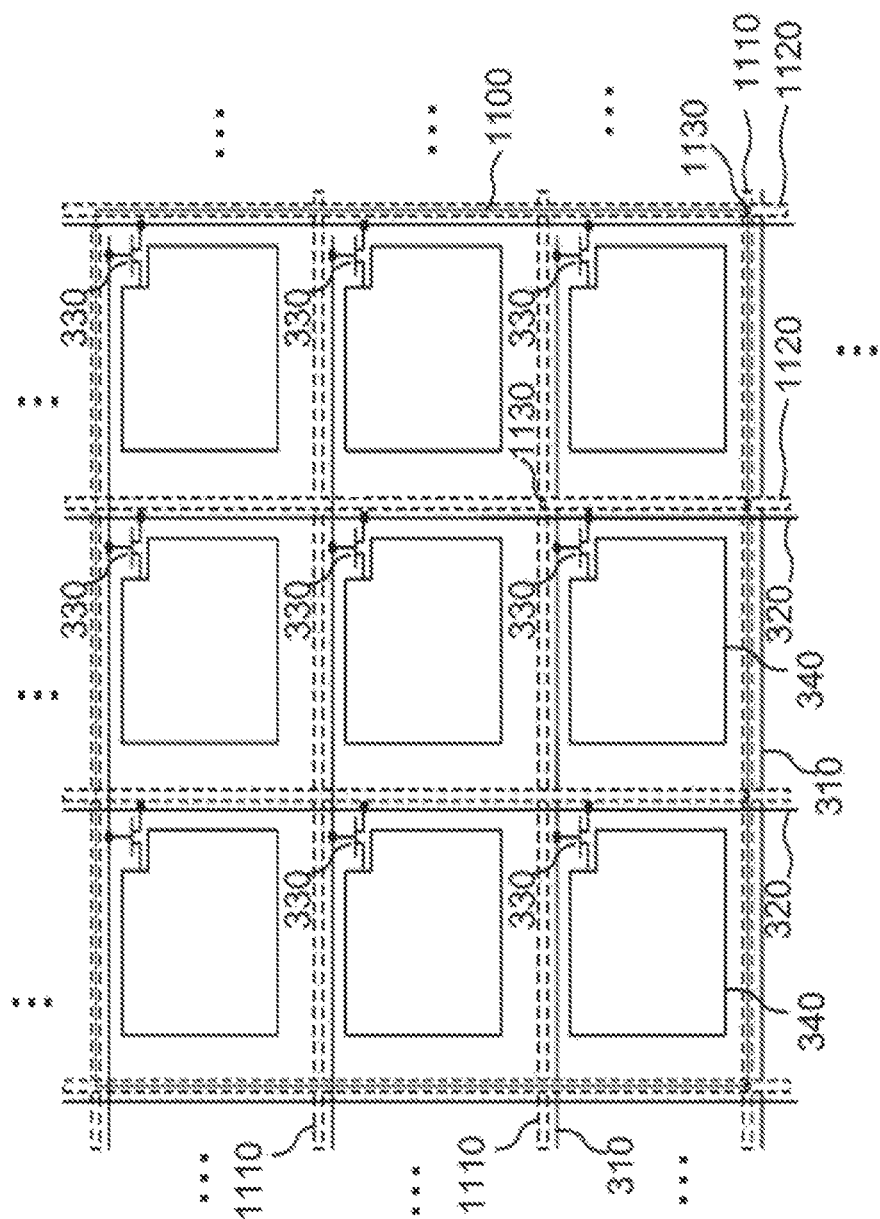
FIG. 11 is further another schematic diagram illustrating the position relationship between the touch sensing electrodes and the pixel electrodes according to the present invention.

Generally, the display layer has two metal layers, one being provided for the layout of the display gate lines 310, and the other being provided for the layout of the display data lines 320. The touch sensing electrode layer formed by the touch sensing electrodes 230 and the display layer formed by the pixel electrodes 340 can be arranged on the same layer. When the touch sensing electrode layer and the display layer are arranged on the same layer, the touch sensing electrodes 230 can be transparent conductive mesh-like electrodes. FIG. 11 is further another schematic diagram illustrating the position relationship between the touch sensing electrodes 230 and the pixel electrodes 340 according to the present invention. As shown in FIG. 11, the transparent conductive mesh-like electrode 1100 is formed by the plurality of transparent conductive wires 1110 and 1120 along the first direction (X-axis direction) and the second direction (Y-axis direction). The transparent conductive wires 1110 and the display gate lines 310 are arranged on the same layer, and the transparent conductive wires 1120 and the display data lines 320 are arranged on the same layer. Due to that the transparent conductive wires 1110 and the transparent conductive wires 1120 of the same transparent conductive mesh-like electrode 1100 are on different layers, they can be electrically connected to each other by via 1130. As shown in FIG. 11, because the transparent conductive wires 1110 and 1120 are transparent, they are drawn in dash lines. The transparent conductive wires 1110 and 1120 are made by the transparent conductive material selected from the group consisting of Indium Tin Oxide (ITO), Indium Zinc Oxide (IZO), Zinc Tin Oxide (ZTO), conductive polymer and carbon nanotube.

In other embodiments, the transparent conductive wires 1110 and 1120 can be replaced by a plurality of metal wires. Due to that the plurality of metal wires are located next to the plurality of display gate lines 310 and the plurality of display data lines 320, the plurality of metal wires can also be shielded by the black matrix, and thus are not easily seen by the user.

Figure 12:
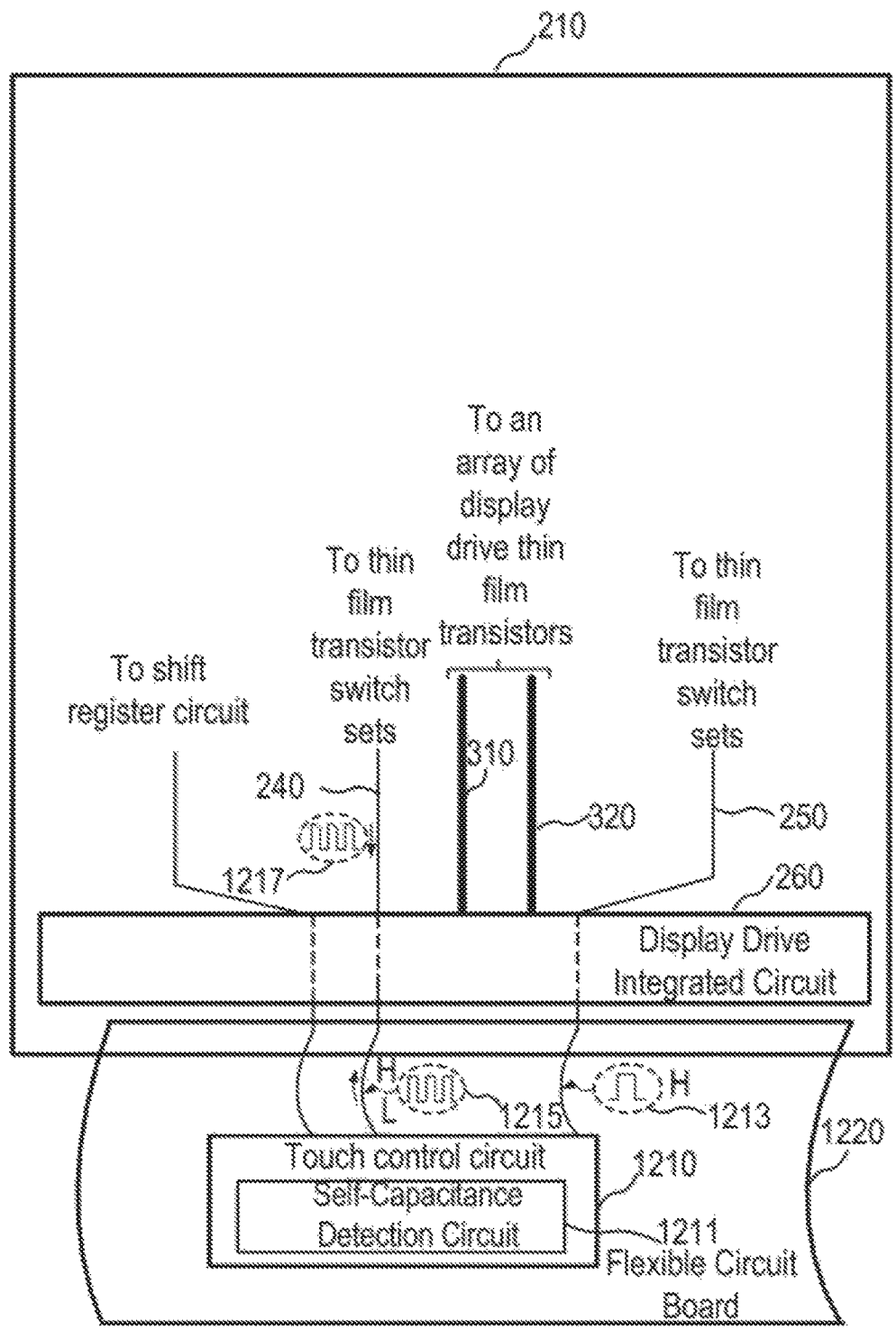
FIG. 12 is a schematic diagram illustrating the connection of the touch sensing substrate and the touch control circuit according to the present invention.

FIG. 12 is a schematic diagram illustrating the connection of the touch sensing substrate 200 and the touch control circuit 1210. As shown in FIG. 12, the touch sensing substrate 200 has a display drive integrated circuit 260 disposed on the substrate 210. The display drive integrated circuit 260 performs the display operation through the plurality of display gate lines 310 and the plurality of display data lines 320. The touch control circuit 1210 is electrically connected to the touch sensing substrate 200 through a flexible circuit board 1220.

The touch control circuit 1210 is a touch integrated circuit. The touch control circuit 1210 includes at least a self-capacitance detection circuit 1211. In the touch operation, the touch control circuit 1210 sequentially or randomly applies an enable control signal 1213 to at least a touch sensing control line 250, applies a touch stimulation signal 1215 to at least a selected touch sensing signal wire 240, and receives a touch sensing signal 1217 from the selected touch sensing signal wire 240. The touch stimulation signal 1215 is transmitted to the touch sensing electrodes 230 through the touch sensing signal wire 240. When being touched or approached by a finger, the touch sensing electrode 230 generates a capacitance effect to change the touch stimulation signal 1215, so as to form the touch sensing signal 1217. The self-capacitance detection circuit 1211 determines whether the corresponding touch sensing electrode 230 is touched or approached by a finger according to the touch sensing signal 1217.

The touch control circuit 1210 and the display drive circuit 260 each have an independent power source and, when in the touch operation, there is no common current loop existed between the two independent power sources.

Figure 13:
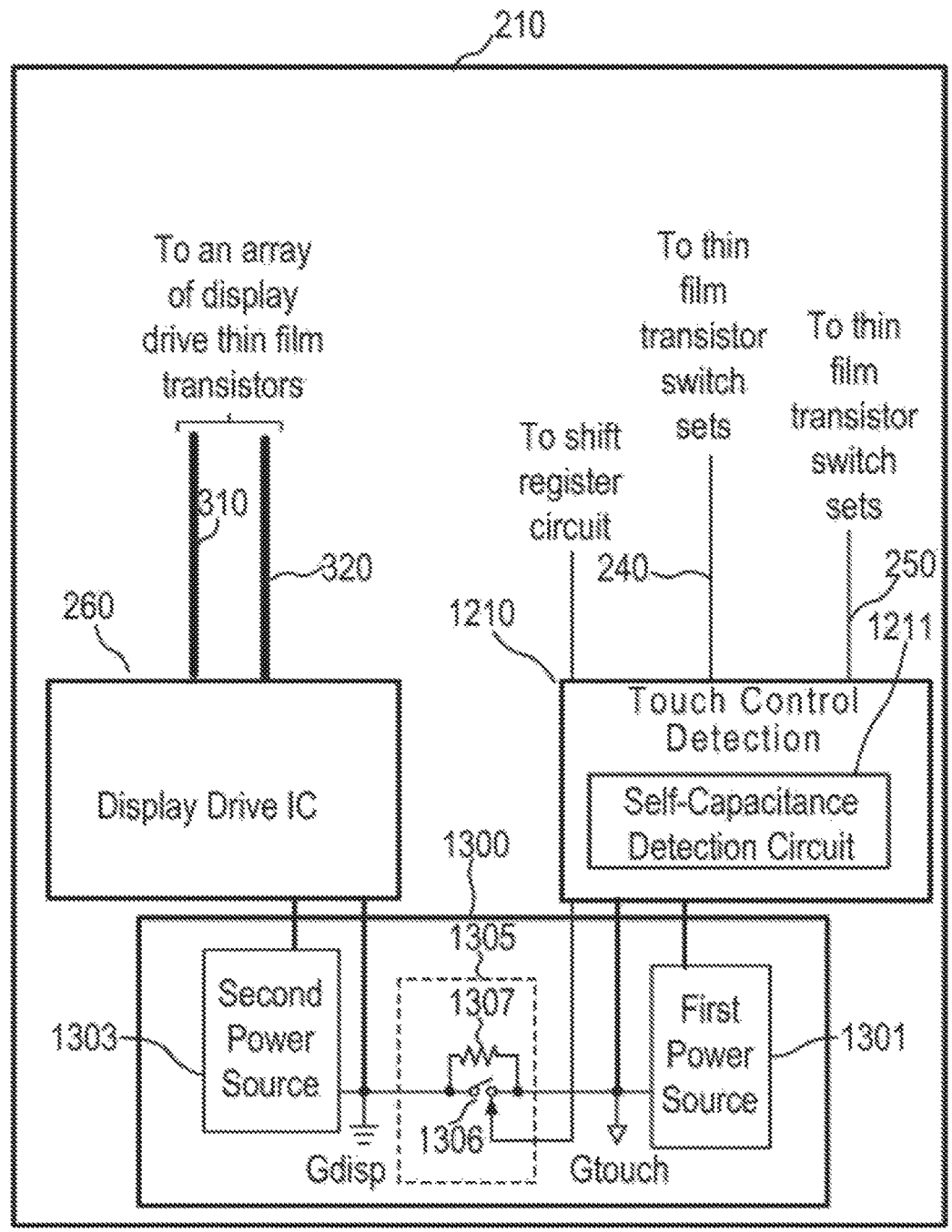
FIG. 13 is another schematic diagram illustrating the connection of the touch sensing substrate and the touch control circuit according to the present invention.

FIG. 13 is another schematic diagram illustrating the connection of the touch sensing substrate 200 and the touch control circuit 1210 according to the present invention, which is similar to FIG. 12 except that, in FIG. 13, the touch control circuit 1210 is disposed on the substrate, and the touch control circuit 1210 and the display drive circuit 260 each have an independent power source, while there is no common current loop existed between the two independent power sources during the touch operation.

As shown in FIG. 13, the touch control circuit 1210 is powered by a first power source 1301. The display drive circuit 260 is powered by a second power source 1303 that is different from the first power source 1301.

The substrate 210 is further provided with a dedicated independent power control circuit 1300. The dedicated independent power control circuit 1300 includes the first power source 1301, the second power source 1303 and a switch device 1305, wherein the switch device 1305 is an SPST (Single Pole Single Throw) type switch 1306, or may include the switch 1306 and a high impedance unit 1307 coupled to two terminals of the switch 1306. In this embodiment, the switch device 1305 includes the switch 1306 and the high impendence unit 1307 coupled to two terminals of the switch 1306.

The ground of the touch control circuit 1210 and the first power source 1301 is regarded as a first ground (Gtouch). The ground of the display drive circuit 260 and the second power source 1303 is regarded as a second ground (Gdisp). When performing the touch sensing operation, there is no common current loop existed between the first power source 1301 and the second power source 1303, or a current loop is formed through the high impedance unit.

The switch device 1305 is connected between the ground of the first power source 1301 and the ground of the second power source 1303, so as to control the ground of the first power source 1301 and the ground of the second power source 1303 to be connected or disconnected. That is, when performing the touch sensing operation, the first power source 1301 and the second power source 1303 are disconnected so that there is no common current loop existed therebetween. When not performing the touch sensing operation, the first power source 1301 and the second power source 1303 are connected so that there is a common current loop existed therebetween.

The switch device 1305 at least includes a switch 1306, which is preferably a transistor switch. Alternatively, the switch device 1305 may further includes a high impedance unit 1307 coupled to two terminals of the switch 1306 to avoid generation of a static voltage difference between the touch control circuit 1210 and the display drive integrated circuit 260. The high impedance unit 1307 can be a resistor with a resistance of greater than 1 MΩ. The touch control circuit 1210 controls the switch 1306 to be on or off. In other embodiments, the display drive integrated circuit 260 controls the switch 1306 to be on or off.

Figure 14:
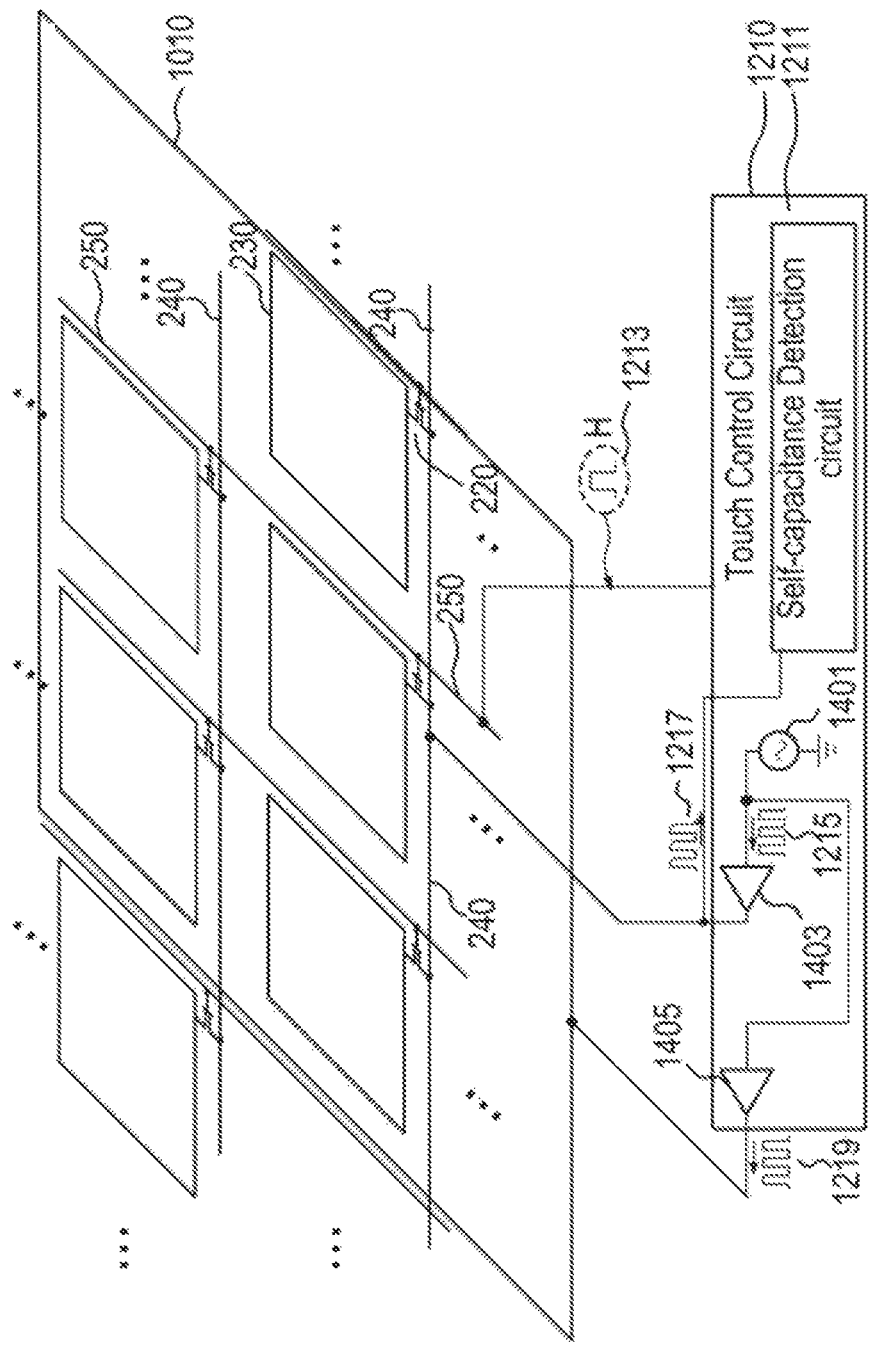
FIG. 14 is a schematic diagram illustrating the operation of the touch control circuit according to the present invention.

FIG. 14 is a schematic diagram illustrating the operation of the touch control circuit 1210. The touch detection circuit 260 includes at least a self-capacitance detection circuit 1211, a signal source 1401, and at least an amplifier circuit 1403, 1405 with a gain greater than zero. When performing a touch operation, the signal source 1401 generates a touch stimulation signal 1215. The touch control circuit 1210 sequentially or randomly outputs the enable control signal 1213 to at least a touch sensing control wire 250, outputs the touch stimulation signal 1215 to at least a selected touch sensing signal wire 240, and receives a touch sensing signal 1217 from the selected touch sensing signal wire 240. Through the amplifier circuit 1405, the touch stimulation signal 1215 generates a capacitance shielding signal 1219 with the same voltage level as the touch stimulation signal 1215 for output to at least a common electrode layer 1010.

Figure 1:
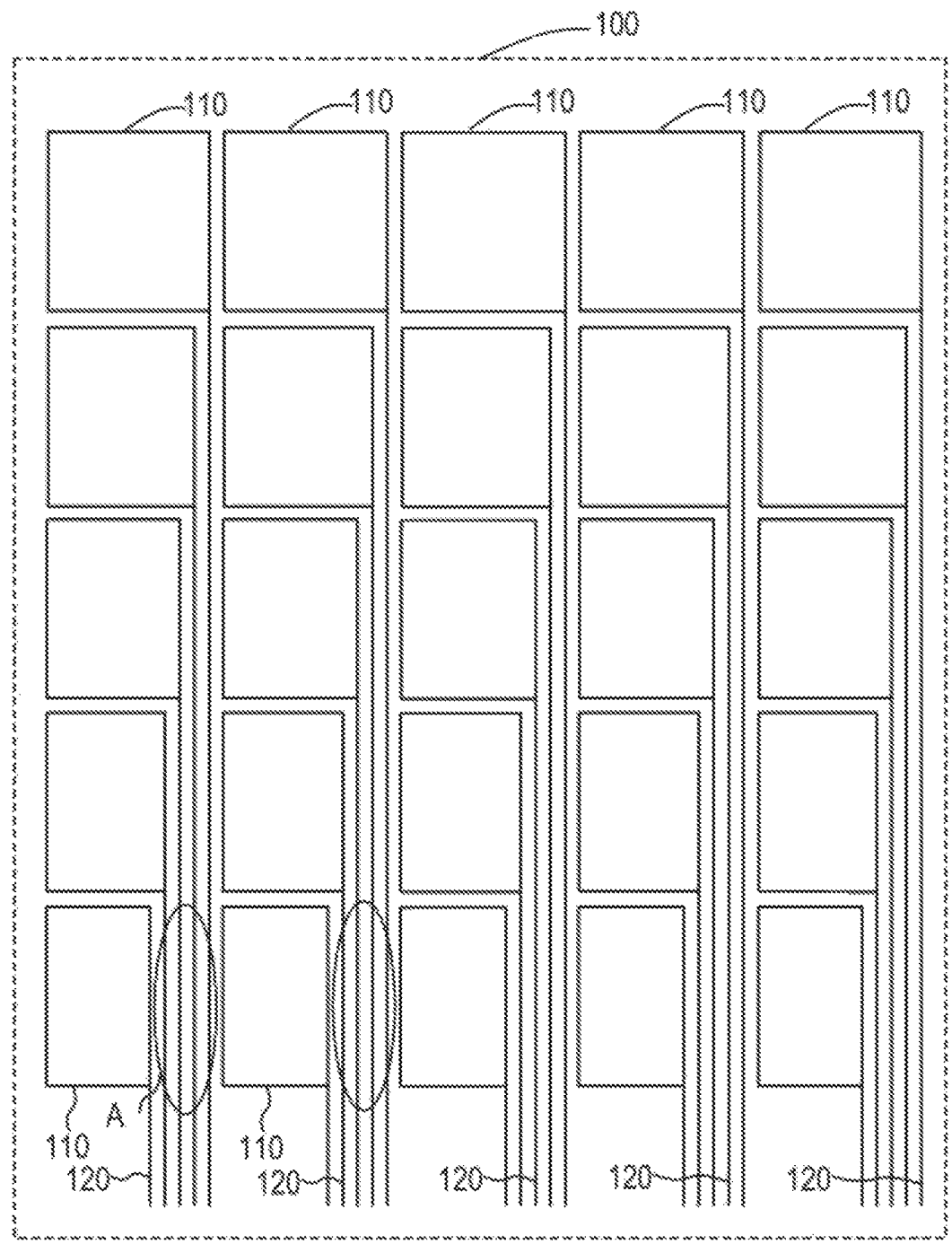
FIG. 1 is a schematic diagram illustrating the prior self-capacitance detection technique.

In view of the foregoing, by comparing the prior art of FIG. 1 with the present invention of FIG. 2, it is known that, when the resolution of touch sensing is 600 (=24×25), the prior art needs 600 signal wires to perform the self-capacitance detection, while the present invention only needs 49 (=24+25) signal wires to perform the self-capacitance detection. When the touch control circuit 1210 is electrically connected to the touch sensing substrate 200 through a flexible circuit board 1220, in the present invention, the number of the signal wires can be greatly decreased, so that the area of the flexible print circuit 1220 is reduced, thereby lowering the manufacturing cost. Furthermore, when the touch control circuit 1210 is disposed on the substrate and the display resolution of the display drive circuit 260 is increased, the layout of the display gate lines 310 and the display data lines 320 on the substrate is getting more and more difficult and, when the signal wires for touch sensing are added, the wiring becomes impossible in the prior art, which is thus not suitable for narrow-boarder display panel. Instead, the present invention can reduce the number of the signal wires to solve the wiring problem, and thus is suitable for narrow-boarder display panel.

Besides, in the present invention, when applying the touch stimulation signal 1215 to a corresponding touch sensing electrode 230, the capacitance shielding signal 1219 with the same voltage level as the touch stimulation signal 1215 is applied to the at least a common electrode layer 1010, thereby not only removing the capacitance effect between sensing electrodes 230 and the common electrodes, but also gathering and raising the electric flux lines on the sensing electrodes, so as to improve the touch sensitivity, increase the effective sensing distance, enhance the signal to noise ratio (SNR), and promote the stability and correctness of the sensing signal.

Although the present invention has been explained in relation to its preferred embodiment, it is to be understood that many other possible modifications and variations can be made without departing from the spirit and scope of the invention as hereinafter claimed.

What is claimed is:

1. A touch sensing substrate, comprising:
   a substrate;
   a plurality of thin film transistor switch sets arranged on one side of the substrate;
   a plurality of touch sensing electrodes, each having an area not smaller than 500 $\mu m^2$ and corresponding to one of the thin film transistor switch sets, each thin film transistor switch set including at least a thin film transistor switch having a gate and a drain/source electrically connected to a touch sensing electrode corresponding thereto;
   a plurality of touch sensing signal wires, each being connected to the thin film transistor switch sets corresponding to at least two touch sensing electrodes, the plurality of touch sensing signal wires being further electrically connected to a touch control circuit disposed on a flexible print circuit board;
   a plurality of touch sensing control wires, each being directly electrically connected to the gates of the thin film transistor switches of the thin film transistor switch sets corresponding to at least two touch sensing electrodes in order to turn on/off the thin film transistor switches of the thin film transistor switch sets;
   a plurality of display gate lines and a plurality of display data lines arranged along a first direction and a second direction, respectively;
   a plurality of display drive thin film transistors, one display drive thin film transistor being disposed at a position where one display gate line and one display data line are intersected, the display drive thin film transistor having a gate connected to the display gate line, and a drain/source connected to the display data line;
   a plurality of pixel electrodes, wherein the drain/source of each display drive thin film transistor is connected to one of the pixel electrodes; and
   an on substrate shift register with an output having a plurality of output terminals respectively connected to the touch sensing control wires, and an input including at least a touch control data wire and a touch control clock wire connected to the touch control circuit through the flexible print circuit board,
   wherein the touch sensing signal wires are different from the display data lines, and the touch sensing control wires are different from the display gate lines.

2. The touch sensing substrate as claimed in claim 1, wherein the touch control circuit includes at least a self-capacitance detection circuit and, when in a touch operation, the touch control circuit sequentially or randomly applies an enable control signal to at least a touch sensing control wire, and applies a touch stimulation signal to at least a selected touch sensing signal wire and receives a touch sensing signal from the selected touch sensing signal wire.

3. The touch sensing substrate as claimed in claim 2, wherein the touch control circuit is a touch integrated circuit.

4. The touch sensing substrate as claimed in claim 3, further comprising a display drive integrated circuit disposed on the substrate.

5. The touch sensing substrate as claimed in claim 4, wherein the touch control circuit and the display drive circuit each have an independent power source and, when in a touch operation, there is no common current loop existed between the two independent power sources.

6. The touch sensing substrate as claimed in claim 1, wherein the touch sensing electrodes are transparent conductive electrodes, metal mesh-like electrodes or transparent conductive mesh-like electrodes.

7. The touch sensing substrate as claimed in claim 6, wherein the touch sensing substrate further includes at least a common electrode layer disposed between the touch sensing signal wires and the display data lines, so as to form a shielding between the touch sensing signal wires and the display data lines.

8. The touch sensing substrate as claimed in claim 7, wherein the touch control circuit includes at least a self-capacitance detection circuit and, when in a touch operation, sequentially or randomly applies an enable control signal to at least a touch sensing control wire, applies a touch stimulation signal to at least a selected touch sensing signal wire, receives a touch sensing signal from the selected touch sensing signal wire, and applies a capacitance shielding signal with same voltage level as the touch stimulation signal to the common electrode layer.

9. The touch sensing substrate as claimed in claim 1, wherein the touch sensing substrate is a thin film transistor substrate of a liquid crystal display or an organic light-emitting diode (OLED) display.

10. The touch sensing substrate as claimed in claim 1, wherein the substrate is a glass substrate or a polymer thin film substrate.

* * * * *